United States Patent
Jung et al.

(10) Patent No.: US 8,952,599 B2
(45) Date of Patent: Feb. 10, 2015

(54) POLARIZATION STRUCTURE, METHOD OF MANUFACTURING THE SAME AND ORGANIC LIGHT EMITTING DISPLAY HAVING THE STRUCTURE

(71) Applicant: Samsung Display Co., Ltd., Yongin-city, Gyeonggi-do (JP)

(72) Inventors: Hae-Goo Jung, Yongin (KR); Jang-Seok Ma, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 4 days.

(21) Appl. No.: 13/666,315

(22) Filed: Nov. 1, 2012

(65) Prior Publication Data
US 2013/0193832 A1  Aug. 1, 2013

(30) Foreign Application Priority Data

Jan. 26, 2012  (KR) .................. 10-2012-0007561

(51) Int. Cl.
*H01J 5/16* (2006.01)
*H01J 61/40* (2006.01)
*H01K 1/26* (2006.01)
*H01K 1/30* (2006.01)

(52) U.S. Cl.
USPC ........... 313/112; 313/504; 313/506; 349/194; 445/23; 445/24

(58) Field of Classification Search
USPC ........ 313/112, 504, 506; 349/194; 445/23, 24
See application file for complete search history.

(56) References Cited

U.S. PATENT DOCUMENTS

| | | | |
|---|---|---|---|
| 5,150,234 A * | 9/1992 | Takahashi et al. | 349/1 |
| 5,365,357 A * | 11/1994 | Ohgawara et al. | 349/111 |
| 5,617,230 A * | 4/1997 | Ohgawara et al. | 349/110 |
| 6,936,960 B2 * | 8/2005 | Cok | 313/506 |
| 7,006,175 B2 * | 2/2006 | Yeh et al. | 349/106 |
| 7,969,538 B2 | 6/2011 | Kubota et al. | |
| 8,035,780 B2 | 10/2011 | Kubota et al. | |
| 2004/0135499 A1* | 7/2004 | Cok | 313/506 |
| 2004/0169795 A1* | 9/2004 | Yeh et al. | 349/106 |
| 2013/0044282 A1* | 2/2013 | Kuwabara et al. | 349/96 |

FOREIGN PATENT DOCUMENTS

| | | |
|---|---|---|
| JP | 2002-072186 A | 3/2002 |
| JP | 2009-175531 A | 8/2009 |
| KR | 10-2004-0054010 A | 6/2004 |

* cited by examiner

*Primary Examiner* — Thomas A Hollweg
(74) *Attorney, Agent, or Firm* — Knobbe, Martens, Olson & Bear, LLP

(57) ABSTRACT

A polarization structure for a display device is disclosed. In one embodiment, the polarization structure includes a retardation layer, a polarizing layer and a polarizing pattern. The retardation layer may be configured to produce a phase difference between two polarization components of an incident light. The polarizing layer may have an adsorption axis along a first direction on the retardation layer. The polarizing layer may include a first region and a second region surrounding at least one side of the first region. The polarizing pattern may have an adsorption axis along a second direction perpendicular to the first direction in the second region.

17 Claims, 6 Drawing Sheets

US 8,952,599 B2

POLARIZATION STRUCTURE, METHOD OF MANUFACTURING THE SAME AND ORGANIC LIGHT EMITTING DISPLAY HAVING THE STRUCTURE

CROSS-REFERENCE TO RELATED APPLICATION

This application claims priority under 35 USC §119 to Korean Patent Application No. 10-2012-0007561 filed on Jan. 26, 2012 in the Korean Intellectual Property Office (KIPO), the contents of which are herein incorporated by reference in its entirety.

BACKGROUND

1. Field

The described technology generally relates to a polarization structure, a method of manufacturing the same and an organic light emitting display having the structure.

2. Description of the Related Technology

An organic light emitting diode (OLED) display can display desired information such as images, letters and/or characters using a light generated by combining holes provided from an anode with electrons provided from a cathode in an organic layer thereof. Flat panel display technologies typically include liquid crystal displays, plasma display panels, field emission displays and OLED displays. Among them, OLED displays have been widely used across a large gamut of products ranging from a portable display such as a cell phone, a smart phone or an MP3 player to a larger display such as a flat panel TV, because they provide many advantages such as a relatively large viewing angle, a fast response speed, a thin profile and low power consumption. Accordingly, OLED technology is considered to be one of the most promising next-generation displays.

SUMMARY

One inventive aspect is a polarization structure having improved optical characteristics.

Another aspect is a method of manufacturing a polarization structure ensuring enhanced optical characteristics.

Another aspect is an organic light emitting display including a polarization structure having improved optical characteristics.

Another aspect is a polarization structure including a retardation layer, a polarizing layer and a polarizing pattern. The retardation layer may be configured to produce a phase difference between at least two polarization components of a light incident onto the display device. The polarizing layer may have an adsorption axis along a first direction over the retardation layer. The polarizing layer may include a first region and a second region surrounding at least one side of the first region. The polarizing pattern may have an adsorption axis along a second direction substantially perpendicular to the first direction in the second region.

The first and second regions may correspond to display and peripheral regions of a display device, respectively and the peripheral region surrounds at least one side of the display region. The polarizing pattern may have a line shape, a bending line shape, a substantially "U" shape, a substantially rectangular band shape, a substantially elliptic band shape, a substantially circular band shape, a substantially polygonal band shape, etc.

The polarization structure may further include a base layer disposed in the first region, the base layer may be substantially optically isotropic, and the polarizing pattern may surround at least one side of the base layer.

The retardation layer may be disposed in the first region and the polarizing pattern may surround at least one side of the retardation layer.

The polarization structure may further include an adhesive layer disposed between the retardation layer and the polarizing layer, the adhesive layer may be disposed in the first region, and the polarizing pattern may surround at least one side of the adhesive layer.

The polarization structure may further include a first protection layer disposed between the retardation layer and the polarizing layer, the first protection layer may be disposed in the first region, and the polarizing pattern may surround at least one side of the first protection layer.

The polarization structure may further include a second protection layer disposed on the polarizing layer, the second protection layer may be disposed in the first region, and the polarizing pattern may surround at least one side of the second protection layer.

Another aspect is an organic light emitting display including a first substrate, a light emitting structure, a peripheral circuit unit and a polarization structure. The first substrate may include a display region and a peripheral region surrounding at least one side of the display region. The light emitting structure may be disposed over a first surface of the first substrate in the display region. The peripheral circuit unit may be disposed on the first surface of the first substrate in the peripheral region. The polarization structure may be disposed on the second surface of the first substrate. The second surface may be opposing the first surface. The polarization structure may include a retardation layer, a polarizing layer and a polarizing pattern. The retardation layer may be configured to produce a phase difference between two polarization components of a light incident onto the organic light emitting display. The polarizing layer may have an adsorption axis along a first direction over the retardation layer. The polarizing layer may include a first region corresponding to the display region and a second region corresponding to the peripheral region. The polarizing pattern may be disposed in the second region. The polarizing pattern may have an adsorption axis along a second direction substantially perpendicular to the first direction.

The organic light emitting display may further include a base layer disposed in the first region, the base layer may be substantially optically isotropic, and the polarizing pattern may surround at least one side of the base layer.

The retardation layer may be disposed in the first region and the polarizing pattern may surround at least one side of the retardation layer.

The organic light emitting display may further include an adhesive layer disposed between the retardation layer and the polarizing layer, the adhesive layer may be disposed in the first region, and the polarizing pattern may surround at least one side of the adhesive layer.

The organic light emitting display may further include a first protection layer disposed between the retardation layer and the polarizing layer, the first protection layer may be disposed in the first region, and the polarizing pattern may surround at least one side of the first protection layer.

The organic light emitting display may further include a second protection layer disposed on the polarizing layer, the second protection layer may be disposed in the first region, and the polarizing pattern may surround at least one side of the second protection layer.

The polarizing pattern may have a line shape, a bending line shape, a substantially "U" shape, a substantially rectangular band shape, a substantially elliptic band shape, a substantially circular band shape, a substantially polygonal band shape, etc.

Another aspect is a method of manufacturing a polarization structure. In the method, a retardation layer may be provided to be configured to produce a phase difference between at least two polarization components of a light incident onto the display device. A polarizing layer may be formed to have an adsorption axis along a first direction over the retardation layer. The polarizing layer may include a first region and a second region. At least one protection layer may be formed on or beneath the polarizing layer. An adhesive layer may be formed between the retardation layer and the polarizing layer. A polarizing pattern having an adsorption axis along a second direction may at least partially surround four sides of at least one of the protection layer, the adhesive layer and the retardation layer. The second direction may be substantially perpendicular to the first direction.

A base layer may be further formed in the first region between the retardation layer and the adhesive layer, between the adhesive layer and the polarizing layer, or between the protection layer and the polarizing layer. The polarizing pattern may surround at least one side of the base layer.

The forming of the polarizing pattern may include removing a portion of the protection layer corresponding to the second region and forming the polarizing pattern surrounding at least one side of the protection layer in the second region.

The forming of the polarizing pattern may include removing a portion of the retardation layer corresponding to the second region and forming the polarizing pattern surrounding at least one side of the retardation layer in the second region.

The forming of the polarizing pattern may include removing a portion of the adhesive layer corresponding to the second region and forming the polarizing pattern surrounding at least one side of the adhesive layer in the second region.

A polarization structure may include a polarizing pattern disposed in a second region. The polarizing pattern may have an adsorption axis substantially perpendicular to an adsorption axis of a polarizing layer.

DESCRIPTION OF EMBODIMENTS

Figure 1:
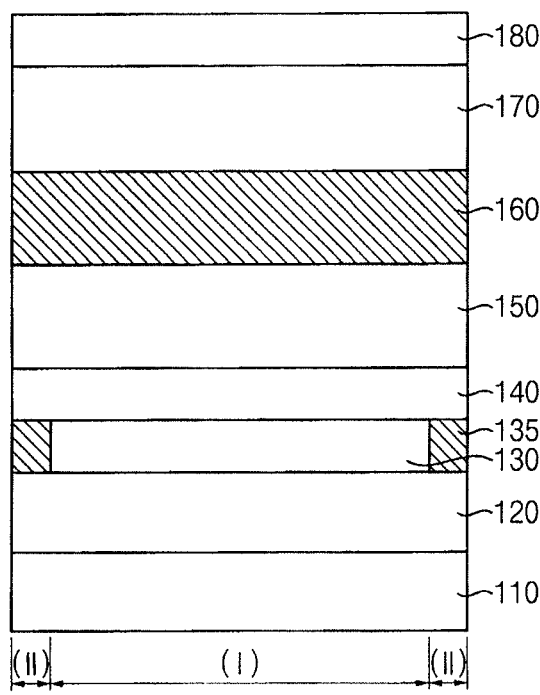
FIG. 1 is a cross-sectional view illustrating a polarization structure in accordance with example embodiments.

An OLED display typically includes a polarization structure on a display panel to prevent or reduce reflection of ambient light.

Generally, the OLED display includes a display region and a peripheral region. An OLED structure is disposed in the display region, and a peripheral circuit is positioned in the peripheral region. To shield the peripheral circuit from a user, a frame or a light shielding layer may cover the peripheral region. However, when the light shielding layer such as a black matrix is provided between a polarization film and the display panel, the layer may be exposed to environmental contamination, and the manufacturing process may be more complicated.

Various embodiments will be described more fully hereinafter with reference to the accompanying drawings, in which some embodiments are shown. The present disclosure may, however, be embodied in many different forms and should not be construed as limited to the embodiments set forth herein. Rather, these embodiments are provided so that this description will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the present disclosure. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of certain embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
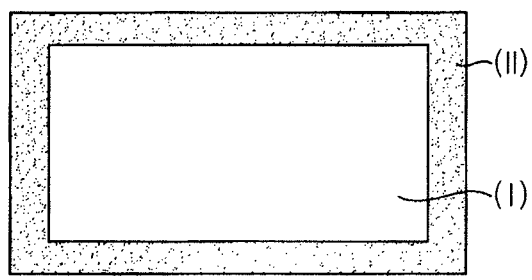
FIG. 2 is a plan view illustrating a polarization structure in accordance with example embodiments.

FIG. 1 is a cross-sectional view illustrating a polarization structure in accordance with example embodiments, and FIG. 2 is a plan view illustrating a polarization structure in accordance with example embodiments.

Referring to FIG. 1, a polarization structure 100 may include a retardation layer 120, a base layer 130, a polarizing pattern 135, a polarizing layer 160, a surface treatment layer 180, at least one adhesive layer, at least one protection layer, etc. The at least one adhesive layer may include a first adhesive layer 110 and a second adhesive layer 140. Additionally, the at least one protection layer may include a first protection layer 150 and a second protection layer 170.

Referring to FIG. 2, the polarization structure 100 may include a first region I and a second region II that may substantially surround or enclose the first region I. The second region II may surround at least one side of the first region I. In example embodiments, as illustrated in FIG. 2, the second region II may enclose four sides of the first region I. In some example embodiments, the second region II may partially contact at least one of the four sides of the first region I. For example, the second region II may be disposed adjacent to at least one of an upper side, a lower side, a left side and a right side of the first region I.

The first region I of the polarization structure 100 may substantially correspond to a display region III of an organic light emitting display (see FIG. 7), and the second region II may substantially correspond to a peripheral region IV where a peripheral circuit of the organic light emitting display may be positioned. The second region II may extend along a first direction and a second direction, which may be substantially perpendicular to a light emitting direction of the organic light emitting display. The second region II may have a predetermined width according to a size of the organic light emitting display.

The first adhesive layer 110 may fix the polarization structure 100 on a display panel (not illustrated) of a display device such as the organic light emitting display. The first adhesive layer 110 may include the first region I and the second region II. The first adhesive layer 110 may include a pressure sensitive adhesive. For example, the pressure sensitive adhesive may include a rubber-based adhesive, an acryl-based adhesive, a vinyl ester-based adhesive, a silicon-based adhesive and/or a urethane-based adhesive. In case that the adhesive layer 110 includes the above-described pressure sensitive adhesive, an adhesion strength between the display panel and the polarization structure 100 may increase when applying a pressure on the first adhesive layer 110.

The retardation layer 120 may be disposed on the first adhesive layer 110. For example, the retardation layer 120 may include a birefringent film containing a polymer such as polystyrene, polycarbonate, polyvinylalcohol, polypropylene, polymethylmethacrylate, polyolefine, polyarylate, polyamide, cyclo-olefin polymer, cyclo-olefin copolymer, etc., an alignment film of liquid crystal polymer and/or an alignment layer containing liquid crystal polymer.

The retardation layer 120 may be configured to produce a phase difference between two polarization components of a light incident onto the display device. The retardation layer 120 may ensure the phase difference between two polarization components that may be substantially perpendicular to each other. For example, the phase difference may be adjusted to about a quarter of a wavelength of the incident light. In example embodiments, the retardation layer 120 includes an inverse wavelength dispersion type retardation film. As for the inverse wavelength dispersion type retardation film, the phase difference between two polarization components may be substantially proportional to the wavelength in a relatively large range of the wavelength of the incident light. For example, the retardation layer 120 may convert a linearly polarized light into a circularly polarized light or may convert a circularly polarized light into a linearly polarized light.

The base layer 130 may be positioned on the retardation layer 120 in the first region. In example embodiments, the base layer 130 includes a transparent polymer that may be optically isotropic. Therefore, the base layer 130 may not substantially affect polarization characteristics of the incident light.

The polarizing pattern 135 may be positioned on the retardation layer 120 in the second region II. The polarizing pattern 135 may make contact with at least one side of the base layer 130. The polarizing pattern 135 may substantially entirely or partially cover the second region II. The polarizing pattern 135 may substantially surround the four sides of the base layer 130. In this case, the polarizing pattern 135 may have various planar shapes such as a substantially rectangular band shape, a substantially elliptic band shape, a substantially circular band shape, a substantially polygonal band shape, etc. Alternatively, the polarizing pattern 135 may be positioned adjacent to at least one of an upper side, a lower side, a left side and a right side of the base layer 130. In this case, the polarizing pattern 135 may have various planar shapes such as a substantially line shape, a substantially bending line shape, a substantially "U" shape, etc. The polarizing pattern 135 may include an iodine-based material, a dye-containing material and/or a polyene-based material. The polarizing pattern 135 may have a polarity due to iodine ion chains aligned with a stretched polyvinyl alcohol film. In some example embodiments, the polarizing pattern 135 has the polarity by dichroic dyes aligned with the stretched polyvinyl alcohol film. In other example embodiments, the polarizing pattern 135 has the polarity due to the polyene-based material generated by a dehydration of a polyvinyl alcohol or a dehydrochloration of a polyvinyl chloride.

The polarizing pattern 135 may allow a polarization component of the incident light having a specific direction to pass therethrough. The polarizing pattern 135 may have a polarization axis and an adsorption axis substantially perpendicular to the polarization axis. In this case, one polarization component of the incident light may be dissipated in the polarizing pattern 135, which may vibrate along a direction of the adsorption axis. Other polarization component of the incident light may pass the polarizing pattern 135, which may vibrate along a direction of the polarization axis. The adsorption axis of the polarizing pattern 135 may be substantially parallel to the second direction.

The second adhesive layer 140 may be disposed on the base layer 130 and the polarizing pattern 135 to hold the first protection layer 150 on the base layer 130 and the polarizing pattern 140. The second adhesive layer 140 may include a material substantially the same as or substantially similar to that of the first adhesive layer 110.

The first protection layer 150 may be disposed on the second adhesive layer 140. The first protection layer 150 may protect or support the polarizing layer 160 disposed thereon. The first protection layer 150 may include an optically isotropic film that may not substantially affect polarization characteristics of the incident light. For example, the first protection layer 150 may include triacetyl cellulose, cyclo-olefin polymer, polyethyleneterephthalate, polypropylene, polycarbonate, polysulfone and/or polymethyl methacrylate.

The polarizing layer 160 may be disposed on the first protection layer 150. In example embodiments, the polarizing layer 160 includes a material substantially the same as or substantially similar to that of the polarizing pattern 135. The polarizing layer 160 may include an adsorption axis and a polarization axis. In example embodiments, the adsorption axis of the polarizing layer 160 is substantially parallel to the first direction, and may be substantially perpendicular to the adsorption axis of the polarizing pattern 135.

The second protection layer 170 may be disposed on the polarizing layer 160 to protect the polarizing layer 160. Therefore, a deformation of the polarizing layer 160, which may be formed by a stretching process, may be prevented by the first and the second protection layers 150 and 170. For example, the second protection layer 170 may include a material substantially the same as or substantially similar to that of the first protection layer 150.

The surface treatment layer 180 may be disposed on the second protection layer 170. The surface treatment layer 180 may include at least one of scattering materials distributed in a polymer resin in order to prevent a reflection of the incident light on the polarization structure 100. For example, the surface treatment layer 180 may include silica particles distributed in acrylate resin.

In the polarization structure 100 illustrated in FIG. 1, the base layer 130 and the polarizing pattern 135 may be disposed between the retardation layer 120 and the second adhesive layer 140, however, the scope of the present disclosure is not limited thereto. For example, the base layer 130 and the polarizing pattern 135 may be disposed at least one of between the second adhesive layer 140 and the first protection layer 150, between the first protection layer 150 and the polarizing layer 160, between the polarizing layer 160 and the second protection layer 170, and between the second protection layer 170 and the surface treatment layer 180.

In example embodiments, the polarization structure 100 includes the polarizing pattern 135 disposed in the second region II. The polarizing pattern 135 may have the adsorption axis substantially perpendicular to the adsorption axis of the polarizing layer 160. The polarizing pattern 135 may serve as a shielding pattern to prevent the incident light from passing therethrough in the second region II. Therefore, optical characteristics of the polarization structure 100 may be improved. When the polarization structure 100 is employed in the organic light emitting display, a peripheral circuit of the organic light emitting display may be shielded, and thus an additional frame or an additional bezel for shielding the peripheral circuit may be omitted. Further, processes for forming an additional light shielding layer such as a black matrix may be omitted. Accordingly, a method of manufacturing the organic light emitting display is simplified.

Figure 3:
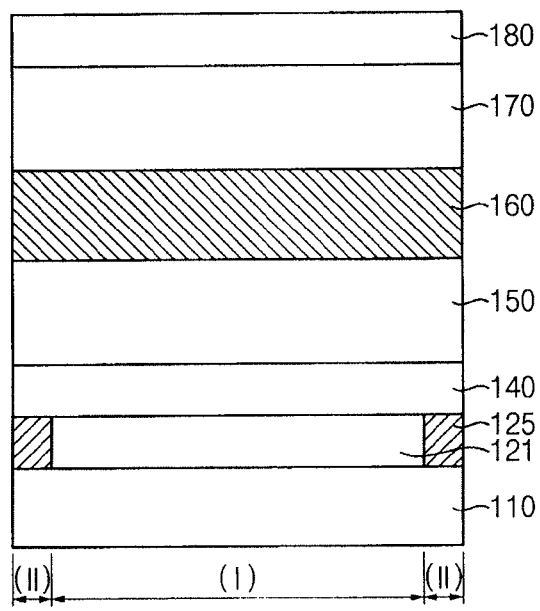
FIG. 3 is a cross-sectional view illustrating a polarization structure in accordance with some example embodiments.

FIG. 3 is a cross-sectional view illustrating a polarization structure in accordance with some example embodiments.

Referring to FIG. 3, a polarization structure 102 in accordance with example embodiments may include a first adhesive layer 110, a retardation layer 121, a polarizing pattern 125, a second adhesive layer 140, a first protection layer 150, a polarizing layer 160, a second protection layer 170, a surface treatment layer 180, etc. As for the polarization structure 102 illustrated in FIG. 3, the first adhesive layer 110, the second adhesive layer 140, the first protection layer 150, the polarizing layer 160, the second protection layer 170 and the surface treatment layer 180 may be substantially the same as or substantially similar to the first adhesive layer 110, the second adhesive layer 140, the first protection layer 150, the polarizing layer 160, the second protection layer 170 and the surface treatment layer 180 described with reference to FIG. 1. Thus, a detail description thereof will be omitted.

The polarization structure 102 may include a first region I and a second region II that may enclose or surround at least one side of the first region I.

The retardation layer 121 may be positioned on the first adhesive layer 110 in the first region I, and the polarizing pattern 125 may be disposed on the first adhesive layer 110 in the second region II. The polarizing pattern 125 may surround at least one side of the retardation layer 121.

The polarizing pattern 125 may allow a polarization component of the incident light having a specific direction to pass therethrough. The polarizing pattern 125 may have an adsorption axis and a polarizing axis. The polarizing pattern 125 may include a material substantially the same as or substantially similar to that of the polarizing pattern 135 described with FIG. 1. The polarizing pattern 125 may substantially surround four sides of the retardation layer 121. Alternatively, the polarizing pattern 125 may contact at least one of an upper side, a lower side, a left side and a right side of the retardation layer 121. For example, the polarizing pattern 125 may have various planar shapes such as a substantially rectangular band shape, a substantially elliptic band shape, a substantially circular band shape, a substantially polygonal band shape, a substantially line shape, a substantially bending line shape, a substantially "U" shape, etc. depending on a shape of a display panel of the display device.

The second adhesive layer 140 may be disposed on the retardation layer 121 and the polarizing pattern 125, and the first protection layer 150 may be positioned on the second adhesive layer 140. The polarizing layer 160 may be disposed on the first protection layer 150. The polarizing layer 160 may have an adsorption axis and a polarization axis. The adsorption axis of the polarizing layer 160 may be substantially perpendicular to the adsorption axis of the polarizing pattern 125. The second protection layer 170 and the surface treatment layer 180 may be sequentially disposed on the polarizing layer 160.

In example embodiments, the polarization structure 102 includes the polarizing pattern 125 disposed in the second region II. The polarizing pattern 125 and the polarizing layer 160 may serve as a shielding pattern to prevent the incident light from passing therethrough in the second region II. The polarizing pattern 125 may shield a peripheral circuit of an organic light emitting display. Therefore, the organic light emitting display including the polarization structure 102 may not require an additional element such as a frame or a bezel.

Figure 4:
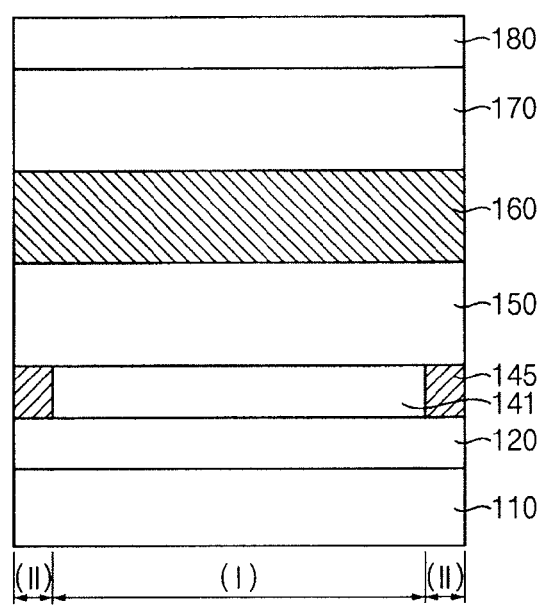
FIG. 4 is a cross-sectional view illustrating a polarization structure in accordance with some example embodiments.

FIG. 4 is a cross-sectional view illustrating a polarization structure in accordance with some example embodiments.

Referring to FIG. 4, a polarization structure 104 in accordance with example embodiments may include a first adhesive layer 110, a retardation layer 120, a second adhesive layer 141, a polarizing pattern 145, a first protection layer 150, a polarizing layer 160, a second protection layer 170, a surface treatment layer 180, etc. As for the polarization structure 104 illustrated in FIG. 4, the first adhesive layer 110, the retardation layer 120, the first protection layer 150, the polarizing layer 160, the second protection layer 170 and the surface treatment layer 180 may be substantially the same as or substantially similar to the first adhesive layer 110, the retardation layer 120, the first protection layer 150, the polarizing layer 160, the second protection layer 170 and the surface treatment layer 180 described with reference to FIG. 1. Therefore, a detail description thereof will be omitted.

In example embodiments, the polarization structure 104 includes a first region I and a second region II. The second region II may surround or enclose at least one side of the first region I.

The retardation layer 120 may be disposed on the first adhesive layer 110, and the second adhesive layer 141 may be positioned on the retardation layer 120 in the first region I.

In example embodiments, the polarizing pattern 145 is located on the retardation layer 120 in the second region II. The polarizing pattern 145 may allow a polarization component of the incident light having a specific direction to pass therethrough. The polarizing pattern 145 may enclose at least one side of the second adhesive layer 141. For example, the polarizing pattern 145 may surround four sides of the second adhesive layer 141, or may partially surround the four sides of the second adhesive layer 141. The polarizing pattern 145 may have a material and a shape substantially the same as or substantially similar to those of the polarizing pattern 135 described with FIG. 1.

The first protection layer 150 may be disposed on the second adhesive layer 141 and the polarizing pattern 145. The polarizing layer 160 may allow a polarization component of the incident light having a specific direction to pass therethrough. In this case, an adsorption axis of the polarizing layer 160 may be substantially perpendicular to an adsorption axis of the polarizing pattern 145. The second protection layer 170 and the surface treatment layer 180 may be sequentially disposed on the polarizing layer 160.

The polarization structure 104 may include the polarizing pattern 145 locating in the second region II. The polarizing pattern 145 and the polarizing layer 160 may prevent the incident light from passing therethrough in the second region II. For example, the polarizing pattern 145 may be disposed in the second region II, such that the polarizing pattern 145 may shield a peripheral circuit of the organic light emitting display. Therefore, in one embodiment, the organic light emitting display does not require an additional element such as a frame or a bezel.

Figure 5:
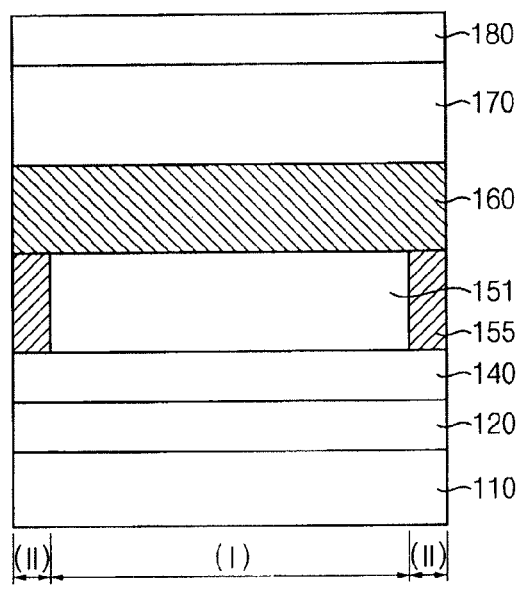
FIG. 5 is a cross-sectional view illustrating a polarization structure in accordance with some example embodiments.

FIG. 5 is a cross-sectional view illustrating a polarization structure in accordance with some example embodiments.

Referring to FIG. 5, a polarization structure 106 in accordance with example embodiments may include a first adhesive layer 110, a retardation layer 120, a second adhesive layer 140, a first protection layer 151, a polarizing pattern 155, a polarizing layer 160, a second protection layer 170, a surface treatment layer 180, etc. In the polarization structure 106 illustrated in FIG. 5, the first adhesive layer 110, the retardation layer 120, the second adhesive layer 140, the polarizing layer 160, the second protection layer 170 and the surface treatment layer 180 may be substantially the same as or substantially similar to the first adhesive layer 110, the retardation layer 120, the second adhesive layer 140, the polarizing layer 160, the second protection layer 170 and the surface treatment layer 180 described with reference to FIG. 1. Thus, a detail description thereof will be omitted. The polarization structure 106 may include a first region I and a second region II that may substantially enclose or surround the first region I.

In example embodiments, the retardation layer 120 and the second adhesive layer 140 are sequentially disposed on the first adhesive layer 110. The first protection layer 151 may be positioned on the second adhesive layer 140 in the first region I. The first protection layer 151 may include a material substantially the same as or substantially similar to that of the first protection layer 150 described with reference to FIG. 1.

The polarizing pattern 155 may be disposed on the second adhesive layer 140 in the second region II. The polarizing pattern 155 may surround at least one side of the first protection layer 151. The polarizing pattern 155 may have a polarization axis and an adsorption axis that may be perpendicular to each other. For example, the polarizing pattern 155 may have various planar shapes such as a substantially rectangular band shape, a substantially elliptic band shape, a substantially circular band shape, a substantially polygonal band shape, a substantially line shape, a substantially bending line shape, a substantially "U" shape, etc.

The polarizing layer 160 may be disposed on the first protection layer 151 and the polarization pattern 155. The polarizing layer 160 may allow a polarization component of the incident light having a specific direction to pass therethrough. The polarizing layer 160 may be supported by the second protection layer 170. The surface treatment layer 180 may be disposed on the second protection layer 170 to prevent a reflection of the incident light.

In example embodiments, the polarization structure 106 includes the polarizing pattern 155 disposed in the second region II. In comparison with the polarization structure 104 described with FIG. 4, the polarization structure 106 with reference to FIG. 5 may include the polarizing pattern 155 having a different location. The polarizing pattern 155 may shield a peripheral circuit of the organic light emitting display. Therefore, in one embodiment, the organic light emitting display including the polarization structure 106 does not require an additional element such as a frame or a bezel.

Figure 6:
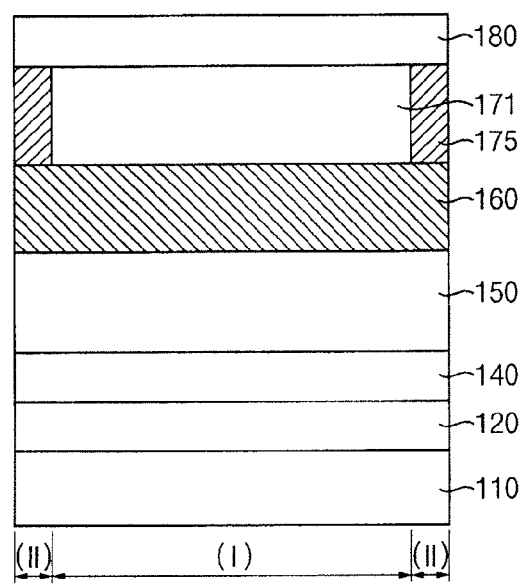
FIG. 6 is a cross-sectional view illustrating a polarization structure in accordance with some example embodiments.

FIG. 6 is a cross-sectional view illustrating a polarization structure in accordance with some example embodiments.

Referring to FIG. 6, a polarization structure 108 according to example embodiments may include a first adhesive layer 110, a retardation layer 120, a second adhesive layer 140, a first protection layer 150, a polarizing layer 160, a second protection layer 171, a polarizing pattern 175, a surface treatment layer 180, etc. As for the polarization structure 108 illustrated in FIG. 6, the first adhesive layer 110, the retardation layer 120, the second adhesive layer 140, the first protection layer 150, the polarizing layer 160 and the surface treatment layer 180 may be substantially the same as or substantially similar to the first adhesive layer 110, the retardation layer 120, the second adhesive layer 140, the first protection layer 150, the polarizing layer 160 and the surface treatment layer 180 described with reference to FIG. 1, and thus a detail description thereof will be omitted. The polarization structure 108 may include a first region I and a second region II.

The retardation layer 120, the second adhesive layer 140, the first protection layer 150 and the polarizing layer 160 may be sequentially disposed on the first adhesive layer 110. The second protection layer 171 may be positioned on the polarizing layer 160 in the first region I. The second protection layer 171 may support or protect the polarizing layer 160.

The polarizing pattern 175 may be disposed on the polarizing layer 160 in the second region II. The polarizing pattern 175 may allow a polarization component of the incident light having a specific direction to pass therethrough. The polarizing pattern 175 may have a polarization axis and an adsorption axis that may be perpendicular to each other. For example, the polarizing pattern 175 may have various planar shapes substantially the same as or substantially similar to that of the polarizing pattern 165 described with FIG. 5.

The surface treatment layer 180 may be disposed on the second protection layer 171 and the polarizing pattern 175 to prevent a reflection of the incident light.

In comparison with the polarization structure 102 described with FIG. 3, the polarization structure 108 with reference to FIG. 6 may include the polarizing pattern 175 having a different position. The polarizing pattern 175 may shield a peripheral circuit of the organic light emitting display. Therefore, in one embodiment, the organic light emitting display including the polarization structure 108 does not require an additional element such as a frame or a bezel.

Figure 7:
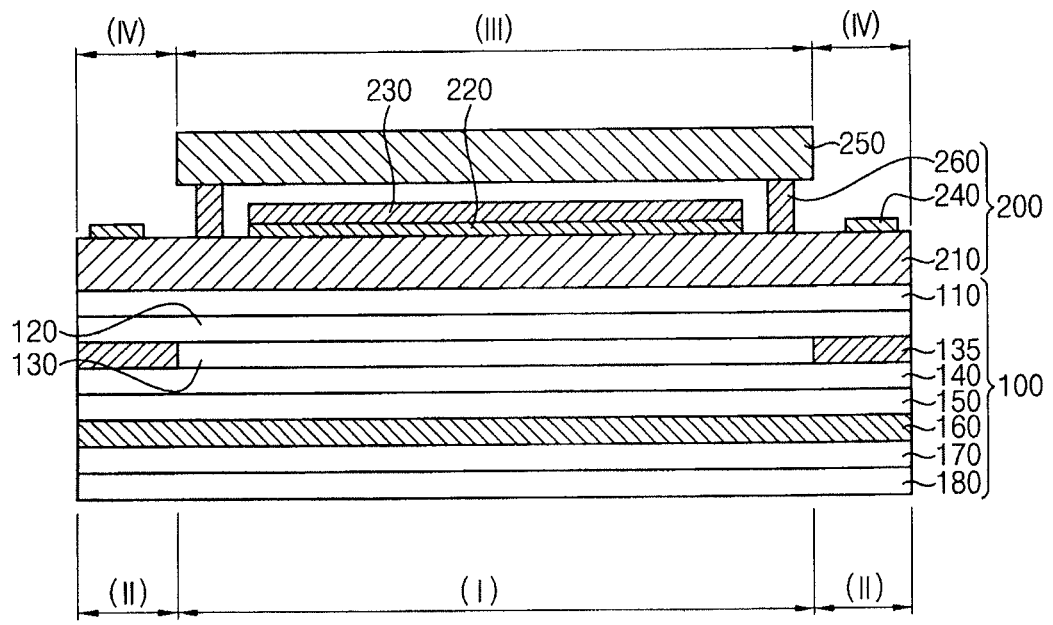
FIG. 7 is a cross-sectional view illustrating an organic light emitting display in accordance with example embodiments.

FIG. 7 is a cross-sectional view illustrating an organic light emitting display in accordance with example embodiments.

Referring to FIG. 7, the organic light emitting display in accordance with example embodiments may include an organic light emitting display panel 200 and a polarization structure 100. The organic light emitting display panel 200 may include a first substrate 210, a switching structure 220, an organic light emitting structure 230, a peripheral circuit unit 240, a second substrate 250, a sealant 260, etc.

The polarization structure 100 may be disposed on a first surface of the first substrate 210. The switching structure 220, the organic light emitting structure 230 and the peripheral circuit unit 240 may locate between the first substrate 210 and the second substrate 250. For example, when the organic light emitting display has a bottom emission type, the polarization structure 100 may be disposed beneath the first substrate 210. The switching structure 220, the organic light emitting structure 230 and the peripheral circuit unit 240 may be positioned on a second surface of the first substrate 210.

In example embodiments, the organic light emitting display panel 200 includes a display region I and a peripheral region II. In this case, the peripheral region II may surround at least one side of the display region I. The organic light emitting structure 230 may be positioned in the display region I, and the peripheral circuit unit 240 including the peripheral circuit may be disposed in the peripheral region II.

The first substrate 210 may include a transparent insulation material. For example, the first substrate 210 may include a glass substrate, a quartz substrate, a transparent resin substrate, a transparent ceramic substrate, etc. In some example embodiments, the first substrate 210 may include a flexible substrate.

When the organic light emitting display panel 200 has an active matrix type, the organic light emitting display panel 200 may include the switching structure 220 disposed on a second surface of the first substrate 210 in the display region I. For example, the switching structure 220 may include a switching device and a plurality of insulation layers.

When the switching device in the switching structure 220 includes the thin film transistor, the switching device may include an active layer, a gate electrode, a source electrode, a drain electrode, etc.

The organic light emitting structure 230 may be disposed on the switching structure 220 in the display region I. The organic light emitting structure 230 may include a plurality of organic layers. For example, the organic light emitting structure 230 may include a hole transfer layer, an organic light emitting layer, an electron transfer layer, etc. The organic light emitting layer may have an organic material or a mixture of an organic material and an inorganic material generating at least one of a red color of light, a green color of light and a blue color of light.

The peripheral circuit unit 240 may be positioned on the first substrate 210 in the peripheral region II. For example, the peripheral circuit unit 240 may include various peripheral circuits such as a gate driving circuit, a data driving circuit, common power supply lines, a driving power supply line, etc. The peripheral circuits may receive a signal from an external portion, and may transfer the signal to organic light emitting structure 230. The peripheral circuit unit 240 may be disposed on the first substrate 210 substantially adjacent to four sides of the display region I. Alternatively, the peripheral circuit unit 240 may be disposed adjacent to at least one of an upper side, a lower side, a left side and a right side of the display region I.

Referring now to FIG. 7, the second substrate 250 may be positioned above the first substrate 210. The second substrate 250 may substantially oppose to the second surface of the first substrate 210. The second substrate 250 may include a transparent substrate or an opaque substrate. For example, the second substrate 250 may include the transparent insulating substrate such as a glass substrate, a quartz substrate, a transparent resin substrate, etc. or the opaque insulating substrate such as a metal substrate, a metal oxide substrate, etc.

The sealant 260 may be disposed between the first substrate 210 and the second substrate 250 to combine the first substrate 210 with the second substrate 250. Therefore, the sealant 260 may prevent a water vapor or contaminants from penetrating into the organic light emitting structure 230, which may avoid a degradation of the organic layers in the organic light emitting structure 230.

Although the organic light emitting display panel 200 may have a bottom emission type as illustrated in FIG. 7, the present disclosure may not be limited to the above-described construction. That is, the organic light emitting display panel 200 may have a top emission type.

Referring to FIG. 7, the polarization structure 100 may be disposed on the first surface of the first substrate 210. The polarization structure 100 may include a first adhesive layer 110, a retardation layer 120, a base layer 130, a polarizing pattern 135, a second adhesive layer 140, a first protection layer 150, a polarizing layer 160, a second protection layer 170, a surface treatment layer 180, etc. As for the organic light emitting display illustrated in FIG. 7, the polarization structure 100 may be substantially the same as or substantially similar to the polarization structure 100 described with reference to FIG. 1, and thus a detail description thereof will be omitted. The first region I and the second region II of the polarization structure 100 may correspond to the display region III and the peripheral region IV of the organic light emitting display panel 200, respectively.

The organic light emitting display illustrated in FIG. 7 may include the polarization structure 100. However, the scope of the present disclosure is not limited thereto. For example, the organic light emitting display may include at least one of the polarization structures 102, 104, 106 and 108 described with reference to FIGS. 3 to 6.

In some example embodiments, the organic light emitting display includes the polarization structure 102 having the polarizing layer 160 and the polarizing pattern 125. The polarizing pattern 125 in the second region II may have an adsorption axis substantially perpendicular to an adsorption axis of the polarizing layer 160. In this case, an incident light may be blocked in the second region II and the peripheral region IV by a combination of the polarizing layer 160 and the polarizing pattern 125. The second region II and the peripheral region IV may not be transparent, so that the peripheral circuit unit 240 may not be exposed. Accordingly, an additional frame and/or an additional bezel for shielding the peripheral circuit unit 240 may be omitted. Further, processes for forming a light shielding layer may be omitted, and an element for shielding the peripheral circuit unit 240 may not be exposed externally. Therefore, the organic light emitting display may ensure a desired durability.

Figure 8:
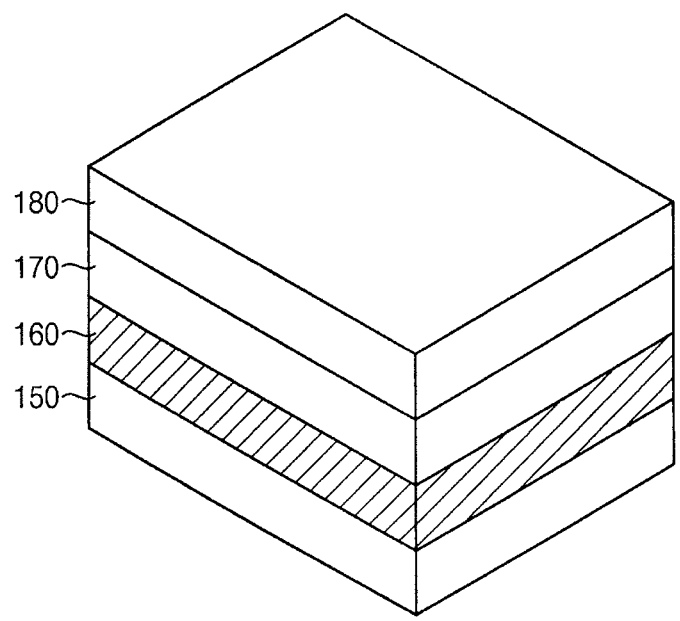
FIGS. 8 to 10 are perspective views illustrating a method of manufacturing a polarization structure in accordance with example embodiments.
Figure 9:
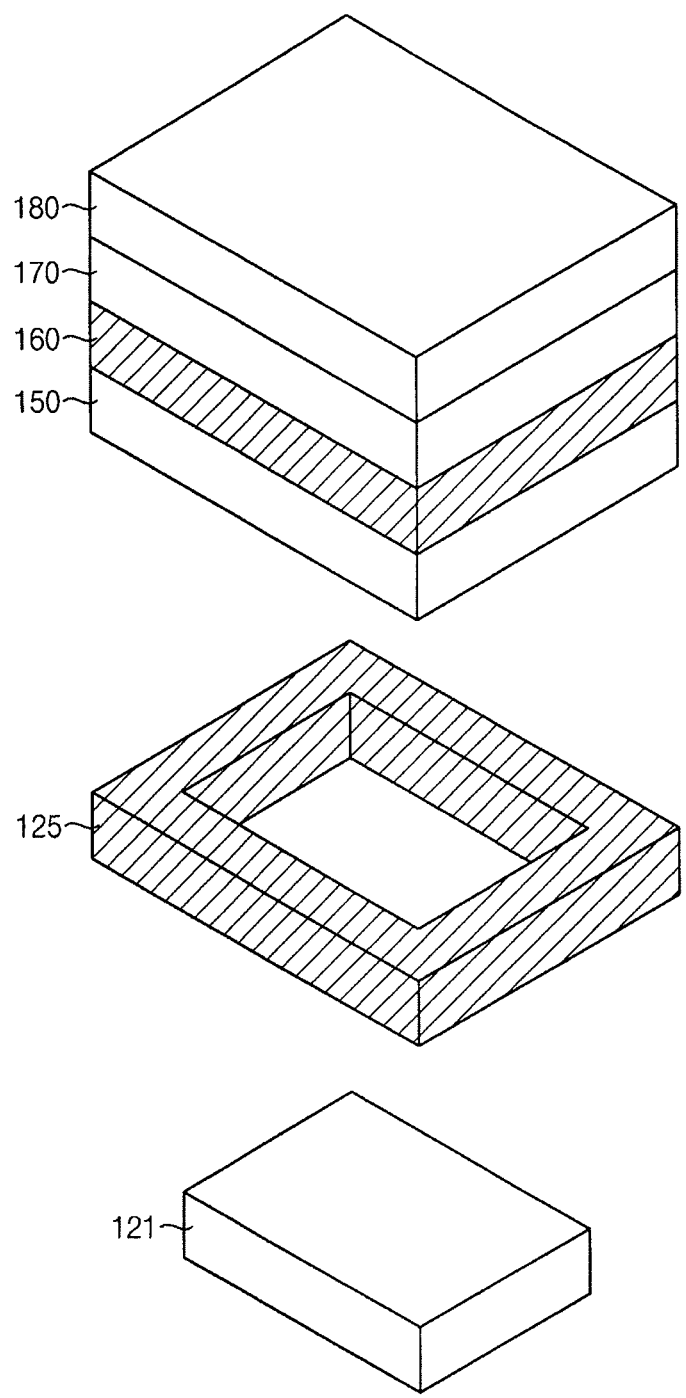
Figure 10:
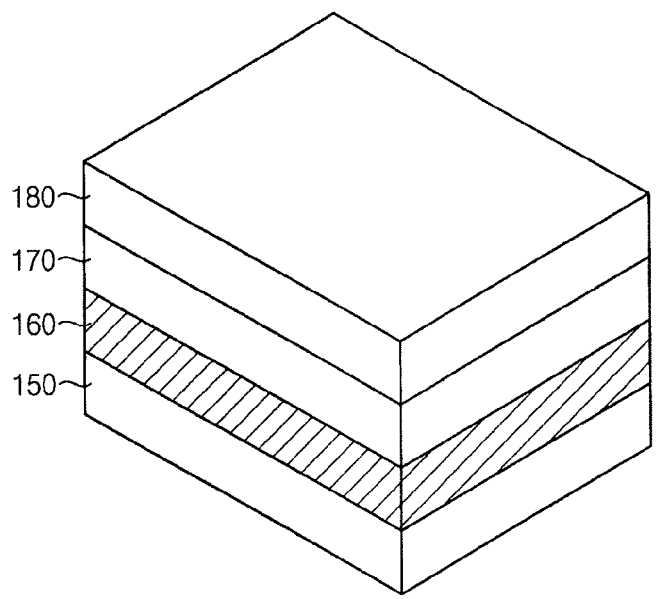
Figure 10:
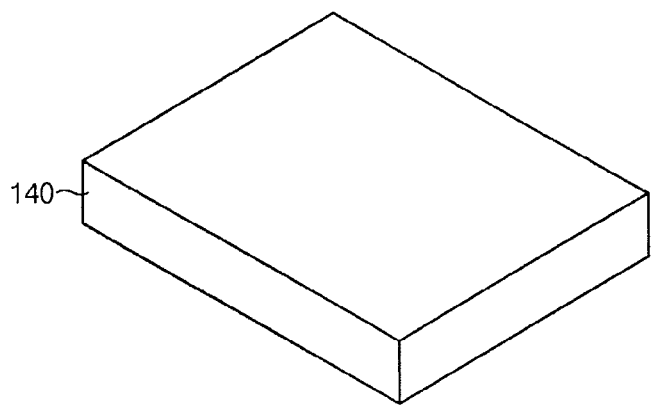
Figure 10:
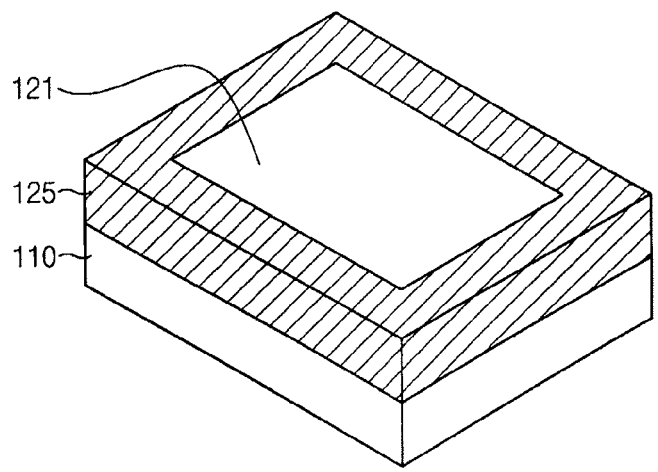

FIGS. 8 to 10 are perspective views illustrating a method of manufacturing a polarization structure in accordance with example embodiments.

Referring to FIG. 8, at least one protection layer may be formed on and/or beneath the polarizing layer 160, and a surface treatment layer 180 may be formed on the at least one protection layer.

In example embodiments, the polarizing layer 160 having an adsorption axis substantially parallel to a first direction is provided. For example, a polyvinyl alcohol film may be stretched in a predetermined direction, and iodine ions or dichroic dyes may be adsorbed in the polyvinyl alcohol film, thereby to form the polarizing layer 160. The iodine ions or the dichroic dyes may be aligned in the predetermined direction, such that the polarizing layer 160 may have an adsorption axis and a polarizing axis.

A plurality of the protection layers may be formed on and beneath the polarizing layer 160. In example embodiments, a first protection layer 150 and a second protection layer 170 including triacetyl cellulose may formed beneath and on the polarizing layer 160, respectively. A surface treatment layer 180 may be formed on the second protection layer 170. The first protection layer 150, the polarizing layer 160, the second protection layer 170 and the surface treatment layer 180 may be laminated. For example, the laminating process may include a roll-to-roll laminating process, a sheet-to-roll laminating process, and a sheet-to-sheet laminating process.

Referring to FIG. 9, a retardation layer 121 and a polarizing pattern 125 may be provided.

The retardation layer 121 may be formed using a birefringent film or an alignment film of liquid crystal polymer. A melt extruding process may be performed to form a cycloolefin polymer film, and the cycloolefin polymer film may be cut to have a size and a shape corresponding to the first region I, thereby forming the retardation layer 121.

A polyvinyl alcohol film may be stretched in a predetermined direction, and iodine ions or dichroic dyes may be adsorbed in the polyvinyl alcohol film to form a preliminary polarizing layer. The preliminary polarizing layer may be cut to have a size and a shape corresponding to the second region II to thereby form the polarizing pattern 125. For example, the thickness of the polarizing pattern 125 may be substantially the same as that of the retardation layer 121. Additionally, a stretching axis of the polarizing pattern 125 may be substantially perpendicular to a stretching axis of the polarizing layer 160.

The polarizing pattern 125 may be formed to surround or substantially enclose at least one side of the retardation layer 125.

Referring to FIG. 10, a second adhesive layer 140 may be formed between the first protection layer 150 and the retardation layer 121, and a first adhesive layer 110 may be formed beneath the retardation layer 121.

The second adhesive layer 140 may be interposed between the first protection layer 150 and the retardation layer 121 to adhere the first protection layer 150 and the retardation layer 121. The first adhesive layer 110 may be arranged beneath the retardation layer 121.

The first adhesive layer 110, the retardation layer 121, the polarizing pattern 125, the second adhesive layer 140, the polarizing layer 160, the first protection layer 150, the second protection layer 170 and the surface treatment layer 180 may be laminated to form a polarization structure 102. The polarizing pattern 125 and the retardation layer 121 may be cut to have sizes and shapes substantially corresponding to a peripheral region and a display region of a display panel, respectively. Therefore, the laminating process may include a sheet-to-roll laminating process or a sheet-to-sheet laminating process.

The polarization structure obtained by the method illustrated in FIGS. 8 to 10 may have a construction substantially the same as or substantially similar to that of the polarization structure 102 described with reference to FIG. 3. However, those ordinary skilled in the art would understand that the method according to example embodiments may be properly and easily modified to manufacture one of the polarization structures 100, 104, 106 and 108 described with reference to FIG. 1 and FIGS. 4 to 6.

According to at least one of the disclosed embodiments, the polarizing pattern serves as a shielding pattern to prevent the incident light from passing therethrough in the second region. Accordingly, optical characteristics of the polarization structure are improved. When the polarization structure is employed in an organic light emitting display, a peripheral circuit of the organic light emitting display may be shielded, and thus an additional frame or an additional bezel for shielding the peripheral circuit may be omitted. Therefore, a method of manufacturing the organic light emitting display may be simplified.

The foregoing is illustrative of embodiments and is not to be construed as limiting thereof. Although a few embodiments have been described, those skilled in the art will readily appreciate that many modifications are possible. Accordingly, all such modifications are intended to be included within the scope of the present disclosure as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:
1. A polarization structure for a display device comprising:
   a retardation layer configured to produce a phase difference between at least two polarization components of a light incident on and provided by the display device;
   a polarizing layer, having an adsorption axis along a first direction, formed over the retardation layer, wherein the polarizing layer includes a first region and a second region; and a polarizing pattern formed only in the second region, wherein the polarizing pattern has an adsorption axis along a second direction substantially perpendicular to the first direction, wherein the first and second regions correspond to display and peripheral regions of the display device, respectively, wherein the peripheral region surrounds at least one side of the display region, and wherein the phase differenced light produced by the retardation layer is substantially blocked in the second region by the combination of the polarizing layer and the polarizing pattern.

2. The polarization structure of claim 1, further comprising:

a base layer disposed in the first region, wherein the base layer is substantially optically isotropic, and wherein the polarizing pattern surrounds at least one side of the base layer.

3. The polarization structure of claim 1, further comprising an adhesive layer disposed between the retardation layer and the polarizing layer, wherein the adhesive layer is disposed in the first region and wherein the polarizing pattern surrounds at least one side of the adhesive layer.

4. The polarization structure of claim 1, further comprising a first protection layer disposed between the retardation layer and the polarizing layer, wherein the first protection layer is disposed in the first region and wherein the polarizing pattern surrounds at least one side of the first protection layer.

5. The polarization structure of claim 1, further comprising a second protection layer disposed on the polarizing layer, wherein the second protection layer is disposed in the first region and wherein the polarizing pattern surrounds at least one side of the second protection layer.

6. The polarization structure of claim 1, wherein the polarizing pattern has one of the following shapes: a line shape, a bending line shape, a substantially "U" shape, a substantially rectangular band shape, a substantially elliptic band shape, a substantially circular band shape and a substantially polygonal band shape.

7. The polarization structure of claim 1, wherein the polarizing pattern is positioned i) between the retardation layer and the polarizing layer or ii) on the polarizing layer.

8. An organic light emitting display comprising:

a first substrate including a display region and a peripheral region surrounding at least one side of the display region;

a light emitting structure disposed over a first surface of the first substrate in the display region;

a peripheral circuit unit disposed on the first surface of the first substrate in the peripheral region; and a polarization structure formed on a second surface of the first substrate, wherein the second surface is opposing the first surface, and wherein the polarization structure includes:

a retardation layer configured to produce a phase difference between at least two polarization components of a light incident on and provided by the organic light emitting display;

a polarizing layer, having an adsorption axis along a first direction, formed over the retardation layer, wherein the polarizing layer includes a first region and a second region; and a polarizing pattern formed only in the second region, wherein the polarizing pattern has an adsorption axis along a second direction substantially perpendicular to the first direction, wherein the first and second regions correspond to the display and peripheral regions of the display device, respectively, and wherein the phase differenced light produced by the retardation layer is substantially blocked in the second region by the combination of the polarizing layer and the polarizing pattern.

9. The organic light emitting display of claim 8, further comprising:

a base layer disposed in the first region, wherein the base layer is substantially optically isotropic, and wherein the polarizing pattern surrounds at least one side of the base layer.

10. The organic light emitting display of claim 8, further comprising an adhesive layer disposed between the retardation layer and the polarizing layer, wherein the adhesive layer is disposed in the first region, and wherein the polarizing pattern surrounds at least one side of the adhesive layer.

11. The organic light emitting display of claim 8, further comprising a first protection layer disposed between the retardation layer and the polarizing layer, wherein the first protection layer is disposed in the first region and wherein the polarizing pattern surrounds at least one side of the first protection layer.

12. The organic light emitting display of claim 8, further comprising a second protection layer disposed on the polarizing layer, wherein the second protection layer is disposed in the first region, and wherein the polarizing pattern surrounds at least one side of the second protection layer.

13. The organic light emitting display of claim 8, wherein the polarizing pattern has one of the following shapes: a line shape, a bending line shape, a substantially "U" shape, a substantially rectangular band shape, a substantially elliptic band shape, a substantially circular band shape and a substantially polygonal band shape.

14. A method of manufacturing a polarization structure for a display device, comprising:

providing a retardation layer configured to produce a phase difference between at least two polarization components of a light incident on and provided by the display device;

forming a polarizing layer having an adsorption axis along a first direction over the retardation layer, wherein the polarizing layer includes a first region and a second region;

forming at least one protection layer on or beneath the polarizing layer;

forming an adhesive layer between the retardation layer and the polarizing layer; and forming a polarizing pattern only in the second region, wherein the polarizing pattern has an adsorption axis along a second direction which is substantially perpendicular to the first direction, wherein the first and second regions correspond to display and peripheral regions of the display device, respectively, wherein the peripheral region surrounds at least one side of the display region, and wherein the phase differenced light produced by the retardation layer is substantially blocked in the second region by the combination of the polarizing layer and the polarizing pattern.

15. The method of claim 14, further comprising:

forming a base layer in the first region between the retardation layer and the adhesive layer, between the adhesive layer and the polarizing layer, or between the protection layer and the polarizing layer, wherein the polarizing pattern surrounds at least one side of the base layer.

16. The method of claim 14, wherein the forming of the polarizing pattern includes:
   removing a portion of the protection layer corresponding to the second region; and
   forming the polarizing pattern which surrounds at least one side of the protection layer in the second region.

17. The method of claim 14, wherein the forming of the polarizing pattern includes:
   removing a portion of the adhesive layer corresponding to the second region; and
   forming the polarizing pattern which surrounds at least one side of the adhesive layer in the second region.

* * * * *